US007525458B2

(12) United States Patent
Morzano et al.

(10) Patent No.: US 7,525,458 B2
(45) Date of Patent: Apr. 28, 2009

(54) METHOD AND APPARATUS FOR CONVERTING PARALLEL DATA TO SERIAL DATA IN HIGH SPEED APPLICATIONS

(75) Inventors: Christopher K. Morzano, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/033,763

(22) Filed: Feb. 19, 2008

(65) Prior Publication Data

US 2008/0136690 A1   Jun. 12, 2008

Related U.S. Application Data

(63) Continuation of application No. 11/218,997, filed on Sep. 1, 2005, now Pat. No. 7,358,872.

(51) Int. Cl.
*H03M 9/00* (2006.01)

(52) U.S. Cl. ........................ 341/100; 341/101

(58) Field of Classification Search ................ 341/100, 341/101
See application file for complete search history.

(56) References Cited

U.S. PATENT DOCUMENTS

| | | | |
|---|---|---|---|
| 3,885,167 | A | 5/1975 | Berglund |
| 5,243,599 | A | 9/1993 | Barrett et al. |
| 5,721,545 | A | 2/1998 | Poplevine |
| 5,726,990 | A | 3/1998 | Shimada et al. |
| 6,556,494 | B2 | 4/2003 | Morzano et al. |
| 6,600,691 | B2 | 7/2003 | Morzano et al. |
| 6,614,371 | B2 | 9/2003 | Zhang |
| 6,696,995 | B1 * | 2/2004 | Foley et al. ................. 341/100 |
| 6,741,193 | B2 | 5/2004 | Nagata |
| 6,970,116 | B2 | 11/2005 | Masaki |
| 7,006,021 | B1 | 2/2006 | Lombaard |
| 2005/0219084 | A1 | 10/2005 | Dietrich et al. |
| 2006/0103557 | A1 * | 5/2006 | Padaparambil .............. 341/101 |

FOREIGN PATENT DOCUMENTS

| | | |
|---|---|---|
| EP | 0 759 664 A2 | 2/1997 |
| EP | 1 028 427 A1 | 8/2000 |

OTHER PUBLICATIONS

Ivan E. Sutherland, Micropipelines, Communications of the ACM, Jun. 1989, vol. 32, pp. 720-729.

R.B. Nubling, J. Yu, K.C. Wang, P.M. Asbeck, N.H. Sheng, M.F. Chang, R.L. Pierson, G.J. Sullivan, M.A. McDonald, A.J. Price, and D.M. Chen; High Speed 8:1 Multiplexer and 1:8 demultiplexer implemented with A/GaAs/GaAs HBTs; Thousand Oaks, CA. USA IEEE Oct. 1990.

Jun Cao, et al.; "OC-192 Transmitter and Receiver In Standard 0.18-μm CMOS"; IEEE Journal of Solid-State Circuits, vol. 37, No. 12; Dec. 2002.

* cited by examiner

*Primary Examiner*—Howard Williams
(74) *Attorney, Agent, or Firm*—Fletcher Yoder (57) ABSTRACT

A method and apparatus to convert parallel data to serial data is provided. More specifically, there is provided a parallel-to-serial converter comprising a data pipeline configured to receive parallel data, and binary sort logic comprising a plurality of switches arranged to receive the parallel data from the data pipeline, and configured to output the parallel data serially.

25 Claims, 8 Drawing Sheets

METHOD AND APPARATUS FOR CONVERTING PARALLEL DATA TO SERIAL DATA IN HIGH SPEED APPLICATIONS

CROSS-REFERENCE TO RELATED APPLICATION

This application is a continuation of U.S. patent application Ser. No. 11/218,997 which was filed on Sep. 1, 2005.

BACKGROUND OF THE INVENTION

1. Field of the Invention

The present invention relates generally to parallel-to-serial conversion and, more particularly, to parallel-to-serial conversion in high speed memory devices.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Semiconductor memory devices such as synchronous dynamic random access memory (SDRAM) devices are widely used in computers and electronic systems. An SDRAM device generally includes a memory array comprising a large number of memory cells each configured to store data. During a memory read operation, data from the memory cells is accessed and output to a data pad (DQPAD) for processing and use by external devices. The operation of the SDRAM is generally based on a common clock signal.

As will be appreciated, there are a number of different types of SDRAM devices. Early generation SDRAM devices are generally configured such that data from the memory cells may be accessed and one bit of data may be output to the DQPAD on every clock cycle. Demands for higher processing speeds led to the development of double data rate (DDR) SDRAM devices. DDR SDRAM devices generally allow for two bits of data to be accessed and output to the DQPAD on every clock cycle. To achieve this, DDR SDRAM devices commonly clock data out to the DQPAD on every rising and every falling edge of the clock signal. DDR SDRAMS generally allow for data to be transferred from the memory device at a clock rate in the range of 200 to 550 MHz.

The next generation of SDRAMS include DDR2 SDRAMS. The advantage of DDR2 over DDR SDRAMS is its ability to run at even higher clock speeds due to an improved electrical interface. With a clock frequency of 100 MHz, an SDRAM will transfer data on every rising edge of the clock pulse, thus achieving an effective 100 MHz transfer rate. Like DDR, DDR2 will transfer data on every rising and falling edge of the clock, achieving an effective rate of 200 MHz with the same clock frequency. DDR2's clock frequency is further boosted by an improved electrical interface running twice as fast as the memory clock, on-die termination, pre-fetch buffers and off-chip drivers. Thus, DDR2 devices have a data transfer rate in the range of 500-667 MHZ. With the next generation of SDRAMs being developed to facilitate data transfer rates in the range of 800-1067 MHZ (DDR3), internal transfer of data within the memory device becomes increasingly difficult to manage.

To facilitate the ever increasing processing speeds, data is often split onto parallel data buses within the memory devices such that concurrent processing may be utilized. While concurrency does improve accessing and processing speeds, eventually, the parallel data is serialized in order to pipeline the output data in a serial manner. Due to the ever increasing transfer rates of the memory devices, parallel-to-serial conversion for serially pipelining the data output from the memory device becomes increasingly challenging.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
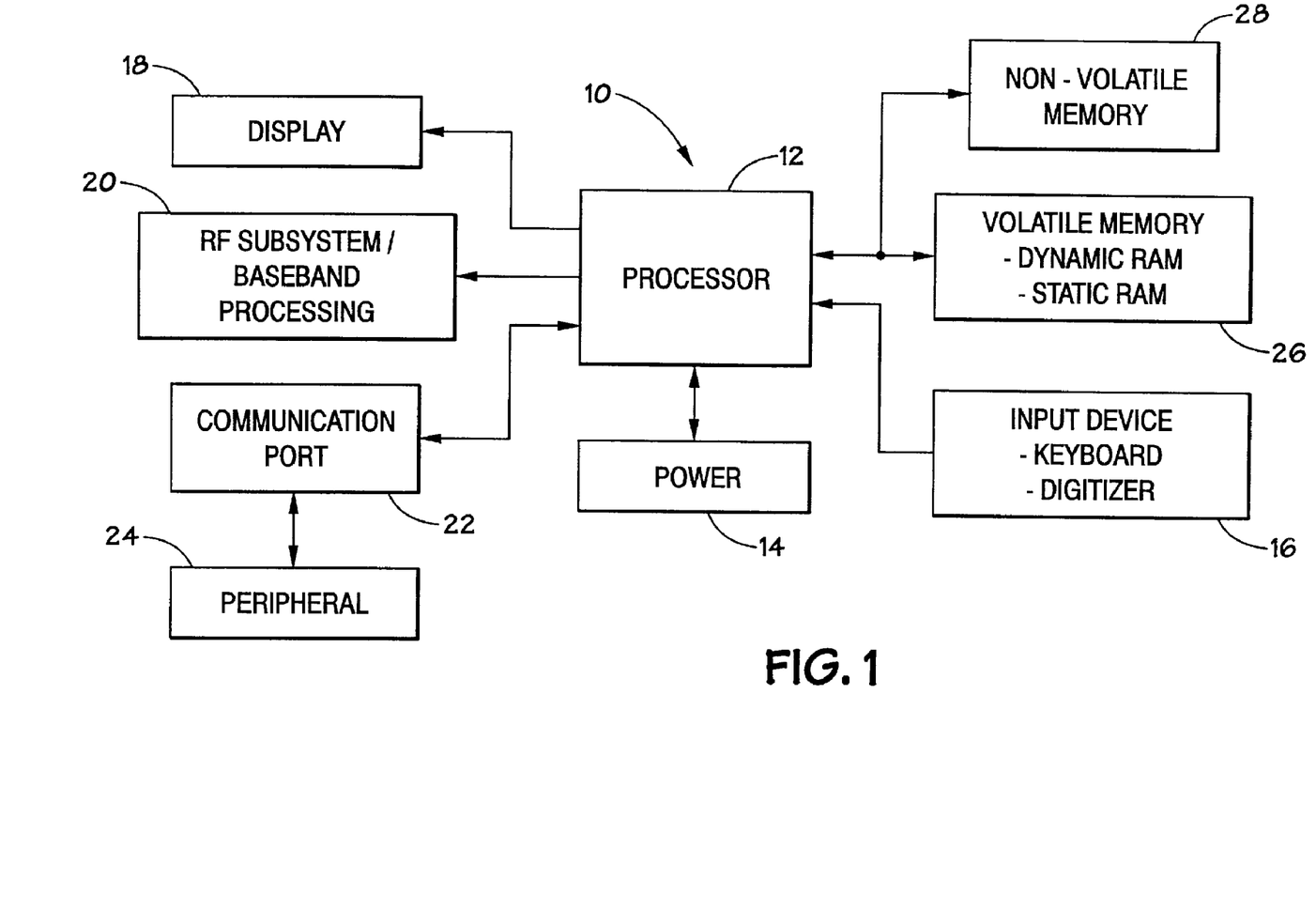
FIG. 1 illustrates a block diagram of an exemplary processor-based device which may incorporate embodiments of the present invention.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include an input device, such as buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communication port 22 may also be coupled to the processor 12. The communication port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the software program. For instance, the processor 12 may be coupled to volatile memory 26, which may include dynamic random access memory (DRAM), static random access memory (SRAM), Double Data Rate (DDR) memory, DDR2, DDR3, etc. The processor 12 may also be coupled to non-volatile memory 28. The non-volatile memory 28 may include a read only memory (ROM), such as an EPROM or Flash Memory, to be used in conjunction with the volatile memory. The size of the ROM is typically selected to be just large enough to store any necessary operating system, application programs, and fixed data. The volatile memory 26, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which may implement DDR, DDR2, or DDR3 technology. As previously discussed, the SDRAM differs from a DRAM in that the SDRAM is controlled synchronously with a timing source, such as the system clock. To accomplish synchronous control, latches are used to provide data and other information on the inputs and outputs of the SDRAM. Thus, in a read operation for example, the processor 12 may access a data output latch a predetermined number of clock cycles after issuing the read request. The predetermined number of clock cycles typically corresponds to the amount of time needed to access the requested data, move the data to the output latch, and allow the data to stabilize. The data is clocked out of the output latch synchronous with the system clock which provides the timing source for the processor 12. Synchronization of the data read from the output latch with the system clock is generally implemented via a delay locked loop (DLL) circuit. In general, the DLL locks the data output signal to the system clock by shifting the output data in time such that it is nominally aligned with the system clock. Thus, the DLL can compensate for timing delays introduced by various components in the SDRAM.

Write operations also are performed synchronously or in synchronization with a timing source, such as the system clock or other externally provided timing source. Thus, data may be clocked into an input latch and written to the memory array under control of a write clock provided from the external device which is performing the write operation. Delay locked loops may also be implemented to synchronize write data with the write clock.

Figure 2:
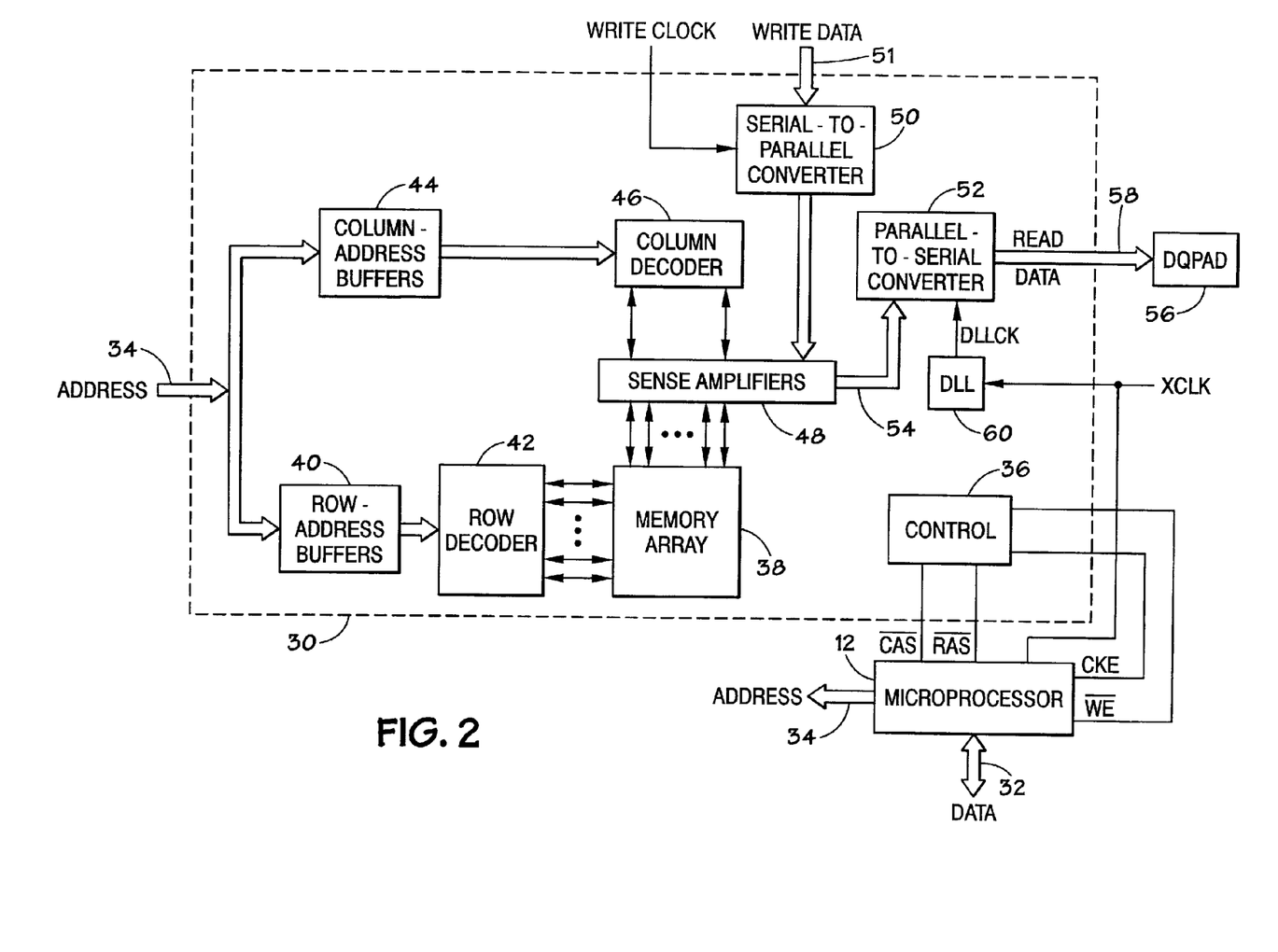
FIG. 2 illustrates a block diagram of an exemplary memory device which may be used in the processor-based device of FIG. 1.

Turning now to FIG. 2, a block diagram depicting an exemplary embodiment of an SDRAM is illustrated. The SDRAM 30 may be a DDR3 SDRAM for example. The present technique may not be limited to DDR3 SDRAMs, and may be equally applicable to other synchronous memory devices, and particularly to other high speed memory devices and other devices for use in communication applications, such as double-edge triggered applications, which may benefit from strict adherence to timing. Those skilled in the art will recognize that various devices may be used in the implementation of the present invention. As will be appreciated, the description of the SDRAM 30 has been simplified for illustrative purposes and is not intended to be a complete description of all features of an SDRAM.

Control, address, and data information provided over a memory bus are represented by individual inputs to the SDRAM 30. These individual representations are illustrated by a data bus 32, address lines 34, and various discrete lines directed to control logic 36. As will be appreciated, the various buses and control lines may vary depending on the system. As is known in the art, the SDRAM 30 includes a memory array 38 which comprises rows and columns of addressable memory cells. Each memory cell in a row is coupled to a word line. Additionally, each memory cell in a column is coupled to a bit line. Each cell in the memory array 38 typically includes a storage capacitor and an access transistor as is conventional in the art.

The SDRAM 30 interfaces with, for example, a processor 12, such as a microprocessor, through address lines 34 and data lines 32. Alternatively, the SDRAM 30 may interface with other devices, such as an SDRAM controller, a microcontroller, a chip set, or other electronic system. The microprocessor 12 also may provide a number of control signals to the SDRAM 30. Such signals may include row and column address strobe signals RAS and CAS, a write enable signal WE, a clock enable signal CKE, and other conventional control signals. The control logic 36 controls the many available functions of the SDRAM 30. In addition, various other control circuits and signals not detailed herein contribute to the operation of the SDRAM 30, as known to one of ordinary skill in the art.

A row address buffer 40 and a row decoder 42 receive and decode row addresses from row address signals provided on the address lines 34. Each unique row address corresponds to a row of cells in the memory array 38. The row decoder 42 typically includes a word line driver, an address decoder tree, and circuitry which translates a given row address received from row address buffers 40 and selectively activates the appropriate word line of the memory array 38 via the word line drivers.

A column address buffer 44 and a column decoder 46 receive and decode column address signals provided on the address lines 34. The column decoder 46 may also determine when a column is defective, as well as the address of a replacement column. The column decoder 46 is coupled to sense amplifiers 48. The sense amplifiers 48 are coupled to complementary pairs of bit lines of the memory array 38.

The sense amplifiers 48 are coupled to data-in (i.e., write) and data-out (i.e., read) circuitry. The data in circuitry may comprise a serial-to-parallel converter 50 configured to receive write data. The serial-to-parallel converter 50 includes data drivers and latches configured to receive external write data serially, and convert the serial write data to parallel data for storage in the memory array 38. During a write operation, the write data bus 51 provides data to the serial-to-parallel converter 50. As will be appreciated, the write data bus 51 is part of the databus 32. The sense amplifier 48 receives data from the serial-to-parallel converter 50 and stores the data in the memory array 38 as a charge on a capacitor of a cell at an address specified on the address line 34. In one embodiment, the write data bus 51 is an 8-bit data bus carrying data at 400 MHz or higher.

During a read operation, the SDRAM 30 transfers data to the microprocessor 12 from the memory array 38. Complementary bit lines for the accessed cell are equilibrated during a precharge operation to a reference voltage provided by an equilibration circuit and a reference voltage supply. The charge stored in the accessed cell is then shared with the associated bit lines. The sense amplifier 48 detects and amplifies a difference in voltage between the complementary bit lines. Address information received on address lines 34 selects a subset of the bit lines and couples them to complementary pairs of input/output (I/O) wires or lines. The I/O wires pass the amplified voltage signals to the data-out circuitry, such a parallel-to-serial converter 52, via an internal data bus 54. The internal data-bus 54 is a parallel data bus that operates at a lower frequency (e.g. 100 MHz) than the data bus 32 (including the write data bus 51 and the read data bus 58). The parallel-to-serial converter 52 is configured to receive parallel data from the slower internal data bus 54 and to transmit the data, serially, to a data pad (DQPAD) 56 via the read data bus 58. As with the write data bus 51, the read data bus 58 is a high speed data bus configured to operate at 400 MHz or higher. As previously discussed, transferring the data at higher external rates than the transfer rates being implemented internally within the SDRAM 30 introduces a number of design challenges. As described further below, embodiments of the present invention may be implemented within the parallel-to-serial converter 52 such that the SDRAM 30 is capable of accurately operating at the high frequencies employed with high speed memory systems, such as DDR, DDR2 and DDR3 systems.

In accordance with embodiments of the present invention and as will be described further with reference to FIG. 3, the parallel-to-serial converter 52 may include a data pipeline to receive parallel data from the sense amplifier 48, via the internal data bus 54, and a plurality of switches configured to direct the parallel data into a serial data stream for output onto the DQPAD 56, via the read data bus 58. As will be appreciated, the DQPAD 56 provides a mechanism for routing the data to a requesting device (such as the processor 12) or any other component in the system 10. The timing source for the parallel-to-serial converter 52 may be provided by a delay locked loop (DLL) circuit 60 which provides a shifted clock signal (DLLCK) which is synchronous with the external system clock signal (XCLK), thus locking the output data signal on the read data bus 58 to the system clock XCLK.

Figure 3:
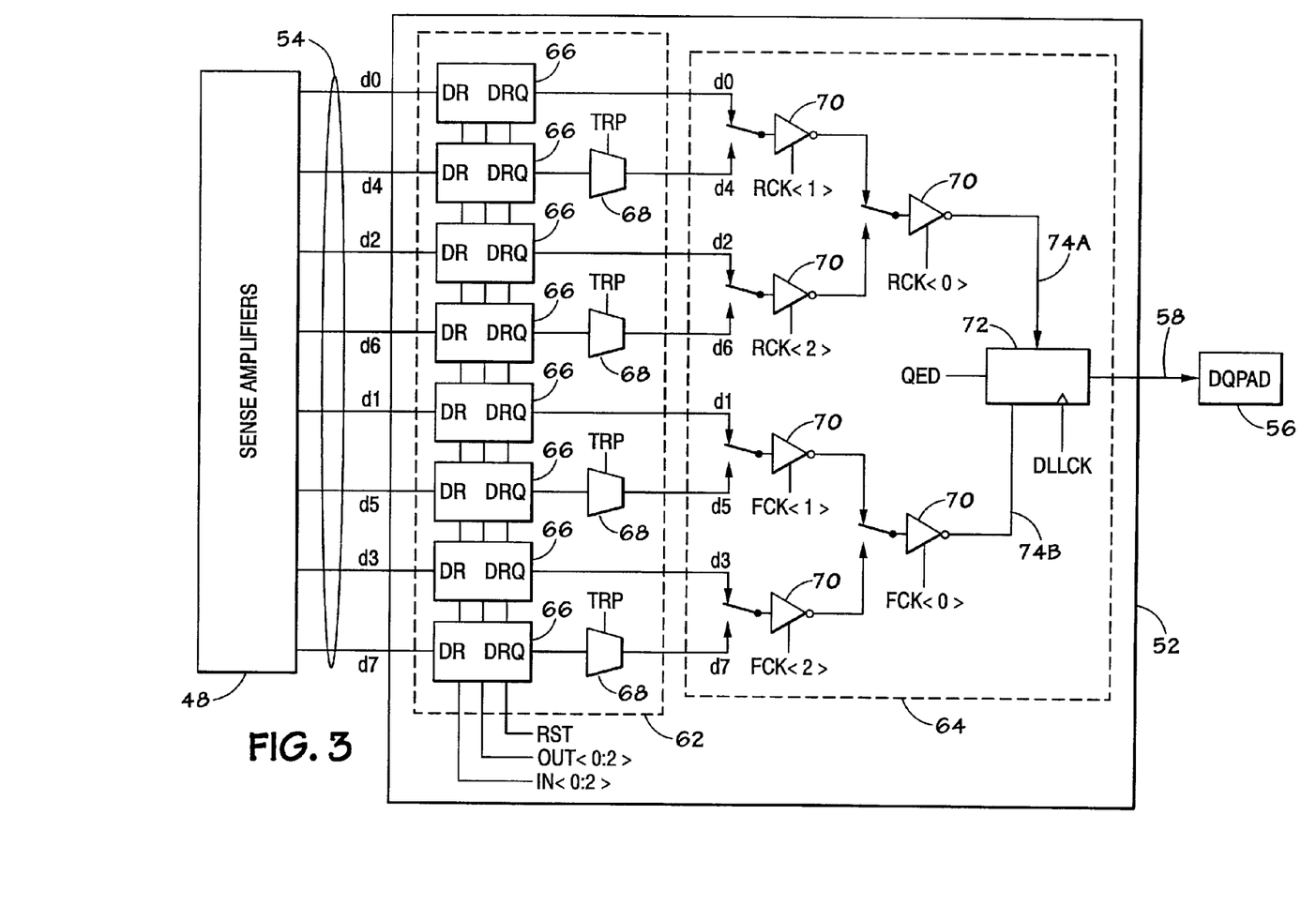
FIG. 3 illustrates a block diagram of an exemplary parallel-to-serial converter in accordance with embodiments of the present invention.

Turning now to FIG. 3, a more detailed block diagram of the parallel-to-serial converter 52 fabricated in accordance with embodiments of the present invention is illustrated. As previously described, the parallel-to-serial converter 52 receives parallel data from the sense amplifiers 48 via the internal data bus 54. The internal data bus 54 includes individual parallel data buses. In the exemplary embodiment, the internal data bus 54 includes eight individual data buses. Each of the individual data buses of the internal data bus 54 is configured to carry one bit of data at a time to the parallel-to-serial converter 52. As will become evident through the discussion below, the data bits are ordered such that the eight bits of the data word, individually represented as d0-d7, are transmitted from the sense amplifiers in an order that will allow proper ordering of the data bits (i.e., d0, d1, d2, d3, d4, d5, d6, and then d7) to the output to the DQPAD 56, via the read data bus 58. As previously described, the read data bus 58 is a serial data bus, while the internal data bus 54 is a parallel data bus. Generally, the presently described parallel-to-serial converter receives the data on the much slower, but parallel, internal data bus 54 and outputs the data onto the read data bus 58 in a serial fashion and at a much higher data rate, matching the external clock rate XCLK.

The parallel-to-serial converter 52 includes a data pipeline 62 and binary data sort logic 64. As will be described in more detail with reference to FIG. 7 below, the data pipeline 62 includes a number of sub-data pipelines 66. Generally, each of the sub-data pipelines 66 is responsible for outputting a single bit of data at a time to the binary data sort logic 64 under the control of the control signals IN<0:2>, OUT<0:2> and RST. The generation of the control signals of the data pipeline 62 is described in more detail with reference to FIG. 8 below. To further enable proper ordering transmission of the individual data bits from the internal data bus 54, those individual data lines carrying the second four bits (upper level) of data from the data word (i.e., d4, d5, d6 and d7) also include a data latch 68 to temporarily hold the respective data bit transmitted from the sub-data pipeline 66 carrying the upper level bit. Each of the data latches 68 is controlled by a trap enable signal TRP. The generation of the trap enable signal TRP will be discussed further below with respect to FIG. 7.

The binary data sort logic 64 includes a plurality of switches 70 and a final stage switching circuit 72. Each of the switches 70 operates under the control of a respective internally generated switch control signals RCK<0>, RCK<1>, RCK<2>, FCK<0>, FCK<1> or FCK<2>. Switch control signals RCK<0>, RCK<1> and RCK<2>, are clocks signals that control data to be released on the rising edge of CLK (DLLCK) and the switch control signals FCK<0>, FCK<1> or FCK<2> which control the release of data on the falling edge of CLK, as will be further illustrated in FIG. 9. Further, the generation of the internal clock signals to control the operation of the switches 70 described in greater detail with respect to FIG. 6. An exemplary embodiment of the switch 70 will be described in more detail with reference to FIG. 4.

In general, each of the switches 70 simply toggles between two data inputs. That is, data is passed through each respective switch 70 under the control of a respective switch control signal. When the control signal is high, the switch will pass data from the first input. When the control signal is low, the switch 70 will pass data from the second input. For instance, starting with the upper left switch 70 illustrated in FIG. 3, the switch 70 will alternate between passing data d0 and passing data d4 under the control of the switch control signal RCK<1>. As will be appreciated, each of the switches 70 actually passes the inverse of the incoming data. However, for simplicity of discussion, references to data passed by the inverters 70 is simply illustrated and described as passing the data signal (rather than the inversion of the data signal). Those skilled in the art will appreciate the concepts described herein without continued reference to the inversion of the signal output by the switches 70. Similarly, the switch 70 immediately below this switch, toggles between passing the data d2 and passing the data d6 under the control of the switch control signal RCK<2>, and so forth.

The first four switches (i.e., the four leftmost switches in FIG. 3) receive input directly from the data pipeline 62. These first four switches 70 make up the "first stage" of the binary data sort logic 64. The next two switches 70 operating under the respective switch control signals RCK<0> and FCK<0> make up the "second stage" of the binary data sort logic 64. The last stage switching logic 72 receives outputs 74A and 74B and toggles data directly to the DQPAD 56 via read data bus 58 under the control of the DLL clock (DLLCK). The last stage switching logic 72 performs the same function as the switches 70 (i.e., toggling between two inputs), but provides for the inclusion of an output enable signal (QED) to enable the operation of the binary data sort logic 64. The last stage switching logic 72 will be described in more detail with respect to FIG. 5, below.

As will be appreciated, each stage of switches (first, second and final) in the binary data sort logic 64 essentially doubles the data transmission frequency such that the parallel data transmitted from the bus 54 is passed to the read data bus 58 and that the read data bus 58 operates at approximately 8× the frequency of the internal bus 54. The data on the read data bus 58 is being transmitted serially and driven at a rate that matches the external clock (XCLK) rate and the DLL clock (DLLCK) rate. The timing relationship of the switch control signals, the DLL clock signal DLLCK and the external clock signal XCLK will be illustrated with respect to FIG. 9.

Figure 4:
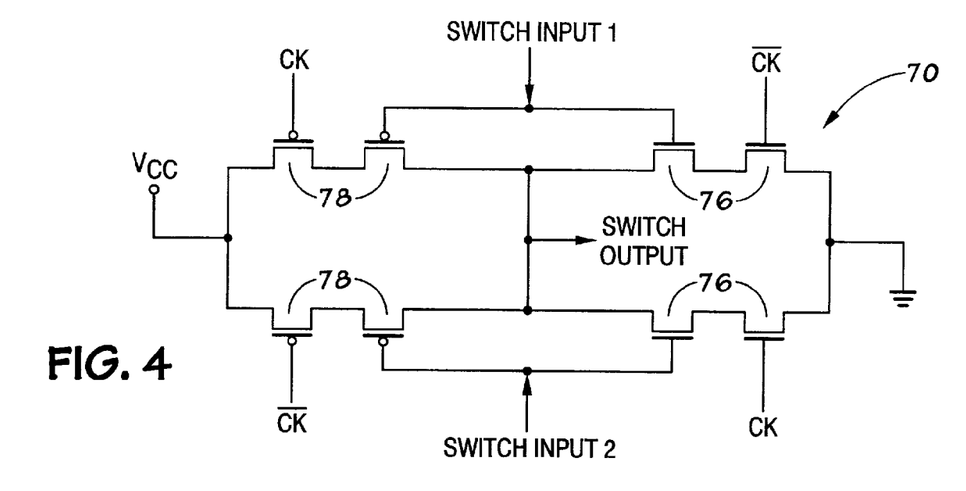
FIG. 4 is a schematic diagram of a switch which may be employed in the parallel-to-serial converter in accordance with embodiments of the present invention.

Referring now to FIG. 4, an exemplary embodiment of the switch 70 is illustrated. As previously described, the switch 70 is configured to switch between two inputs (SWITCH INPUT 1 AND SWITCH INPUT 2) under the control of a switch control signal CK (and its inverse). The switch 70 includes four N-channel transistors 76 and four P-channel transistors 78 configured as illustrated in FIG. 4. When the switch control signal CK is low, the output terminal (SWITCH OUTPUT) is the inverse of SWITCH INPUT 1. When the switch control signal CK is high, the switch flips such that the SWITCH OUTPUT receives SWITCH INPUT 2. Thus, the SWITCH OUTPUT is the inverse of the selected input.

Referring again briefly to FIG. 3, the exemplary embodiment of the switch 70 illustrated in FIG. 4 may be described in accordance with the block diagram previously described. For instance, referring to the switch 70 in the upper left of the binary data sort logic 64, the switch 70 switches between SWITCH INPUT 1 (here, d0) and SWITCH INPUT 2 (here, d4) under the control of the switch control signal CK (here, RCK<1>) and its inverse. Those skilled in the art will appreciate that other switch configurations may be employed as well. What is important to note is that the switch 70 toggles between two input signals based on one or more control signals.

Figure 5:
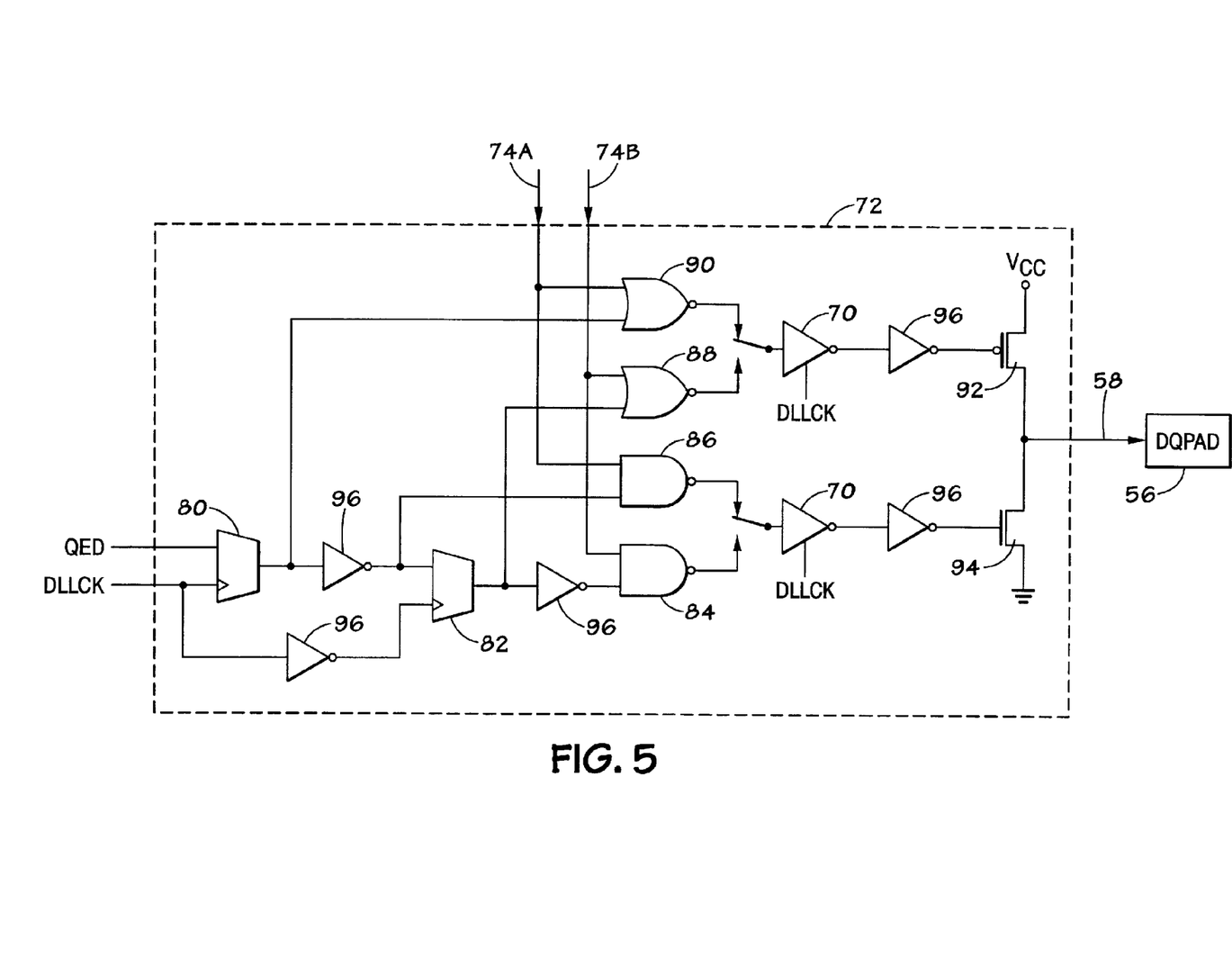
FIG. 5 is a schematic diagram of a switching element which may be employed in the last stage of the parallel-to-serial converter in accordance with embodiments of the present invention.

Referring now to FIG. 5, an exemplary embodiment of the last stage switching circuit 72 is illustrated. As previously described, the switching circuit 72 toggles between the input received on bus 74A and the input received on bus 74B (illustrated in FIG. 3) under the control of DLLCK. Further, additional logic has been added such that an output enable signal QED may be implemented to facilitate data transmission to the DQPAD 56 on each of the rising and falling edges of the DLLCK signal. Accordingly, to combine the data enable control signal QED, the control clock DLLCK and the data inputs provided on buses 74A and 74B, multiplexers 80 and 82, NAND gates 84 and 86, and NOR gates 88 and 90 are provided as illustrated in FIG. 5. The outputs of the NAND gates 84 and 86 are coupled to a switch having the same configuration as the switches 70 in the first and second stages of the binary data sort logic 64, and described above with reference to FIG. 4. The switch 70 of the last stage switching logic 72 generally operates as previously described with reference to FIGS. 3 and 4 and operates under the control of DLLCK. Similarly, a second switch 70, also operating under the control of DLLCK toggles between the outputs provided by the NOR gates 88 and 90. Based on the toggle state of these switches 70, the transistors 92 and 94 determine which data is finally output onto the DQPAD 56. As will be appreciated, the final stage switching circuit 72 may also include a number of inverters 96 to ensure proper signal states for operation of the switching circuit 72. In summary, the final stage switching circuit 72 toggles between outputting the data received on the input buses 74A and 74B under the control of DLLCK, once the data enables.

Figure 6:
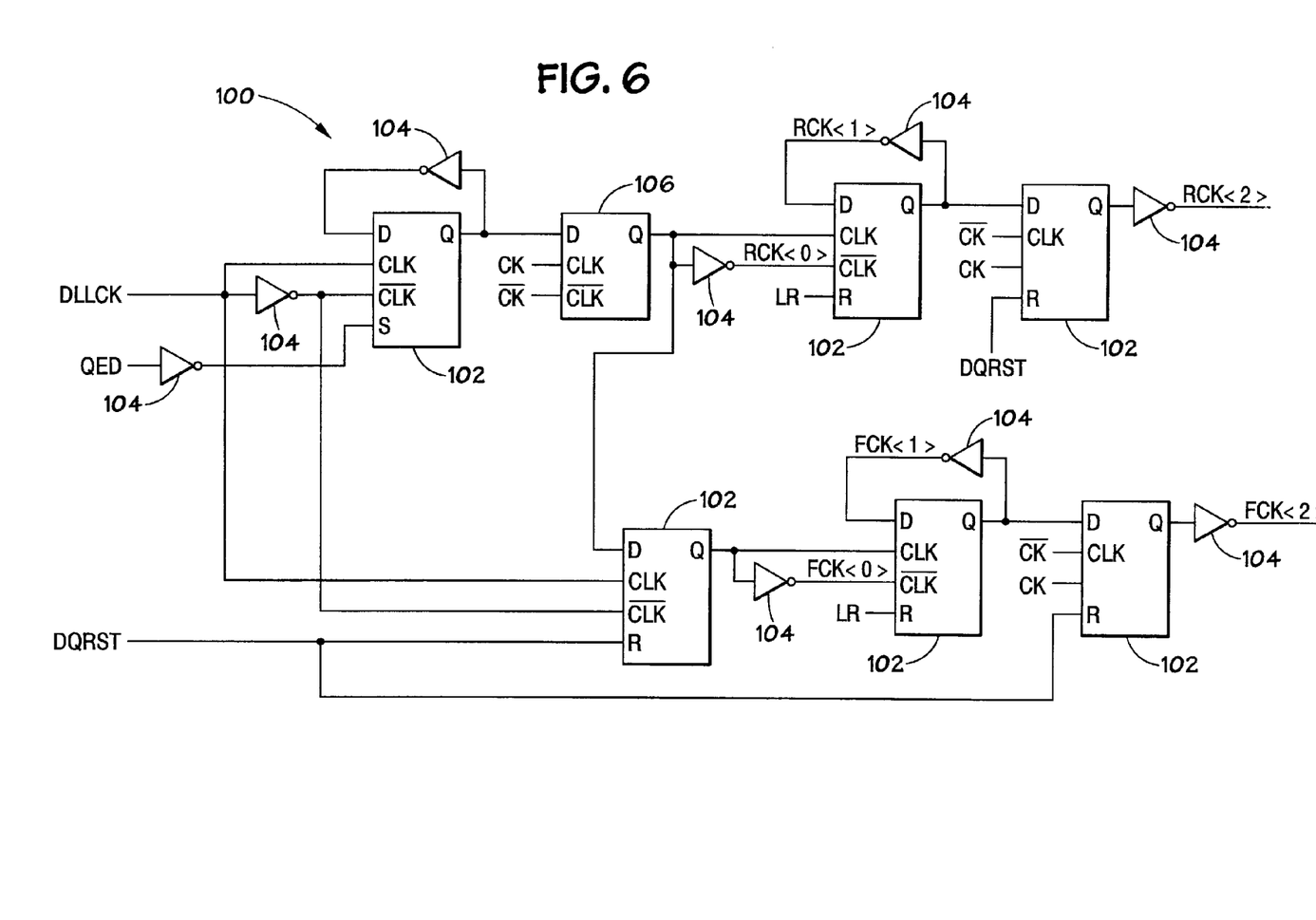
FIG. 6 is a schematic diagram of a clock generator circuit configured to control the switches employed in the parallel-to-serial converter in accordance with embodiments of the present invention.

Referring now to FIG. 6, a clock generator circuit 100 is provided. The clock generator circuit 100 may be implemented to internally generate the switch control signals RCK<0>, RCK<1>, RCK<2>, FCK<0>, FCK<1> and FCK<2>. Each of the switch control signals is essentially generated from the DLLCK signal received from the DLL 60 (FIG. 2). As with the last stage switching logic 72, the exemplary clock generation circuit 100 also receives a data enable signal QED such that generation of the switching control signals is only conducted when the QED signal is asserted. The clock generation circuit 100 includes a number of flip flops 102 configured to latch data to their respective outputs, based on the state of the incoming clock and enable signals as illustrated in FIG. 6. The clock generation circuit 100 includes a number of inverters 104 to provide inversion of incoming signals. Further, the clock generation circuit 100 includes a latch 106 which passes the data through when the CLK input (DLLCK) is low and locks the data out when the DLLCK signal is high.

Those skilled in the art will appreciate the operation of the clock generation circuit 100 illustrated with reference to FIG. 6. Other embodiments of the clock generation circuit 100 may also be employed. For the purposes of this discussion the clock generation circuit 100 is simply provided to generate the switch control signals RCK<0>, RCK<1>, RCK<2>, FCK<0>, FCK<1> and FCK<2> for controlling the individual switches 70 of the binary data sort logic 64 for controlling the first and second stages of the binary data sort logic 64. Various internal logic may be employed to perform this function. It is also relevant to note that each of the switch control signals is generated from only the DLLCK signal through the logic provided in the clock generation logic 100. The relationship between each of the switch control signals and the DLLCK signal will be described in more detail with reference to FIG. 9.

Figure 7:
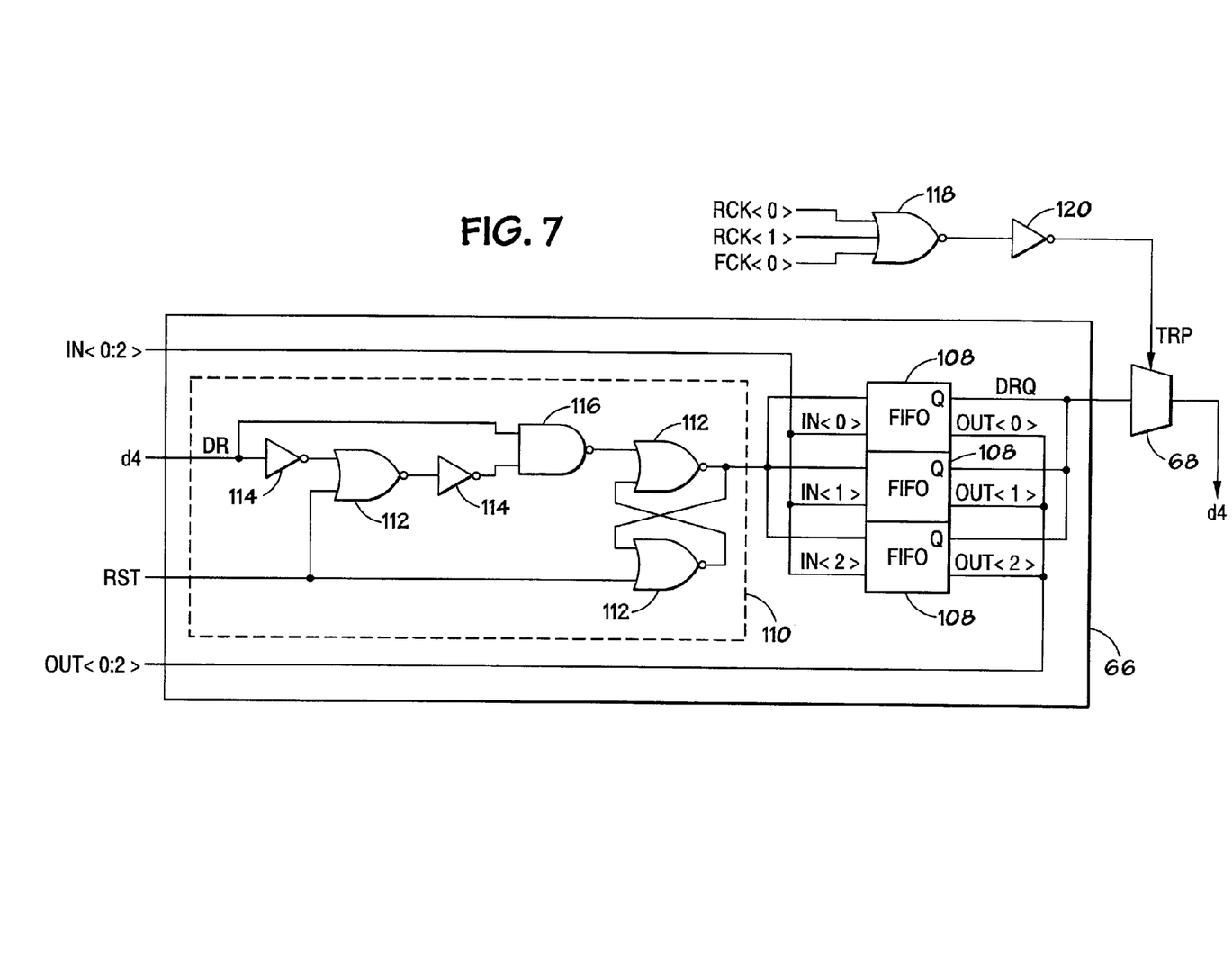
FIG. 7 is a schematic diagram of a sub-data pipeline in the parallel-to-serial converter in accordance with embodiments of the present invention.

Referring now to FIG. 7, a schematic diagram of an exemplary sub-data pipeline circuit 66 is illustrated. As previously described, each sub-data pipeline circuit 66 is simply configured to latch data bits in order from the read data bus 58 to the binary data sort logic 64, one bit at a time, and under the control of the input and output control signals IN<0:2> and OUT<0:2>. For illustrative purposes, the sub-data pipeline circuit 66 of FIG. 7 is illustrated as receiving the data d4 (FIG. 3). This represents the second parallel data line of the data bus 54 (FIG. 3). As illustrated in FIG. 7, the sub-data pipeline circuit 66 includes three storage latches 108 employed for slow cycle, high latency. The storage latches 108 may be first in first out (FIFO) storage devices for instance. The latches 108 receive an input signal (here, the data signal d4) through a timing control block 110 under the synchronized control of input signals IN<0:2>. The data is latched out of the latches 108 under the control of the output control signals OUT<0:2>. The input control signal IN<0:2> traps data in the respective latch 108 and the signal OUT<0:2> switches the data out. The IN<0:2> signals are self-timed and are faster than the data. These input control signals arrive before the data. The OUT<0:2> control signals are based off of the DLLCK signal, as described further with respect to FIG. 8.

The timing control circuit 110 is implemented to hold valid data and convert pre-charged data to DC to smooth timing from remote (versus close) data. The timing control circuit 110 includes three NOR gates 112, two inverters 114 and an AND gate 116, which may be arranged as illustrated in FIG. 7. The timing control circuit 110 is provided to help with timing differences between data bits arriving from memory locations close to the parallel-to-serial converter 52, versus data bits arriving from more distant memory locations. As will be appreciated, the data bits arrive as pulses. The timing is generally defaulted to match with either the closer memory locations or the more distant memory locations. For instance, data arriving from a memory location very close to the parallel-to-serial converter 52 may have a short pulse and something very far away may have a long pulse. The timing control circuit 110 traps the pulse and aligns the timing from all of the different areas of the memory array 38. The reset signal RST is also gated into the timing control circuit 110 to reset the latch through the lower gate. The RST signal aids in aligning the near and far data by holding off new data that is too fast and clearing out old data that lingers into the next cycle so that new data may arrive. In general, the circuit 110 provides a larger window for the data to be sent.

Also illustrated in FIG. 7, is the data latch 68 (FIG. 3). As previously described, the data latch 68 is employed to temporarily trap the upper bits of the incoming eight bit data word under control of the trap control signal TRP. The TRP signal is generated by combining the switch control signals RCK<0>, RCK<1> and FCK<0> using a NAND gate 118. An inverter 120 may also be employed to ensure proper polarity of the trapper control signal TRP. This allows the switching of OUT<0:2> to have half a data byte cycle (the time it takes to output 4 bits) margin to switch without interrupting the data stream.

Figure 8:
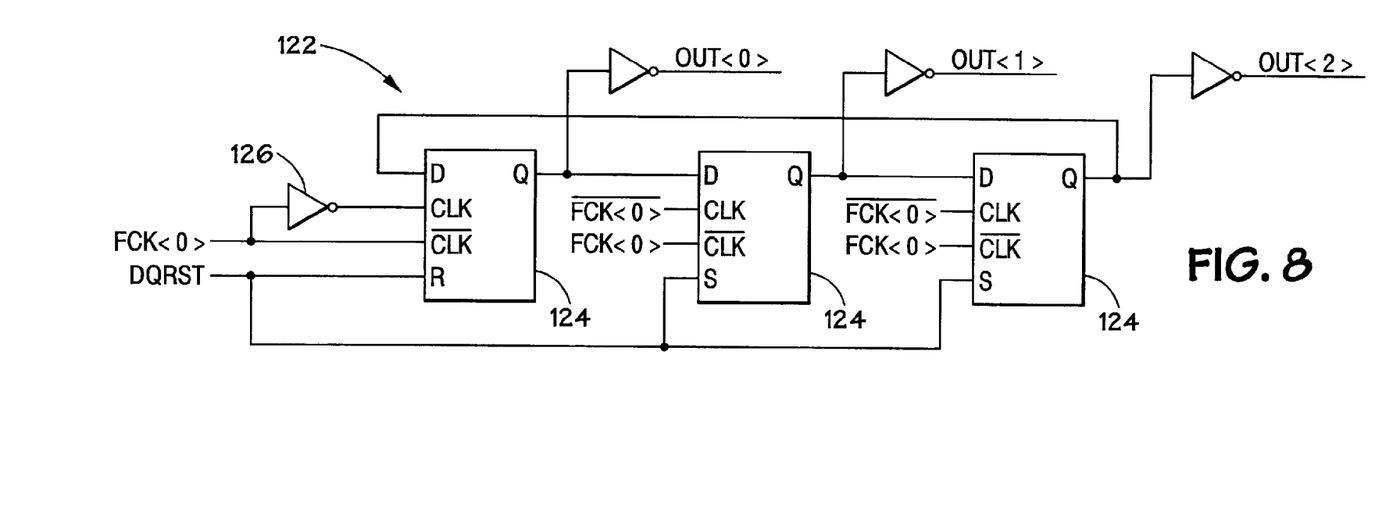
FIG. 8 is a schematic diagram of a pointer control circuit for controlling portions of the sub-data pipeline of FIG. 7, in accordance with embodiments of the present invention.

Referring now to FIG. 8, an exemplary circuit 122 for generating the output control signals OUT<0:2> is illustrated. The circuit 122 includes flip-flops 124 which operate under the control of the switch control signal FCK<0> and its inverse, as illustrated in FIG. 8. As will be appreciated, in the circuit 122, the first flip-flop 124 is a reset (R) flip-flop, while the second and third flip-flops 124 are set (S) flip-flops. An inverter 126 may be provided to generate the inverted control signal from the FCK<0> input. Because the switch control signal FCK<0> is based off of the DLLCK signal, the output control signals OUT<0:2> are also derived from the DLLCK signal. As illustrated in FIG. 8, the circuit 122 may be employed to generate the output control signals OUT<0:2> employed to latch data out of the sub-data pipelines 66.

Figure 9:
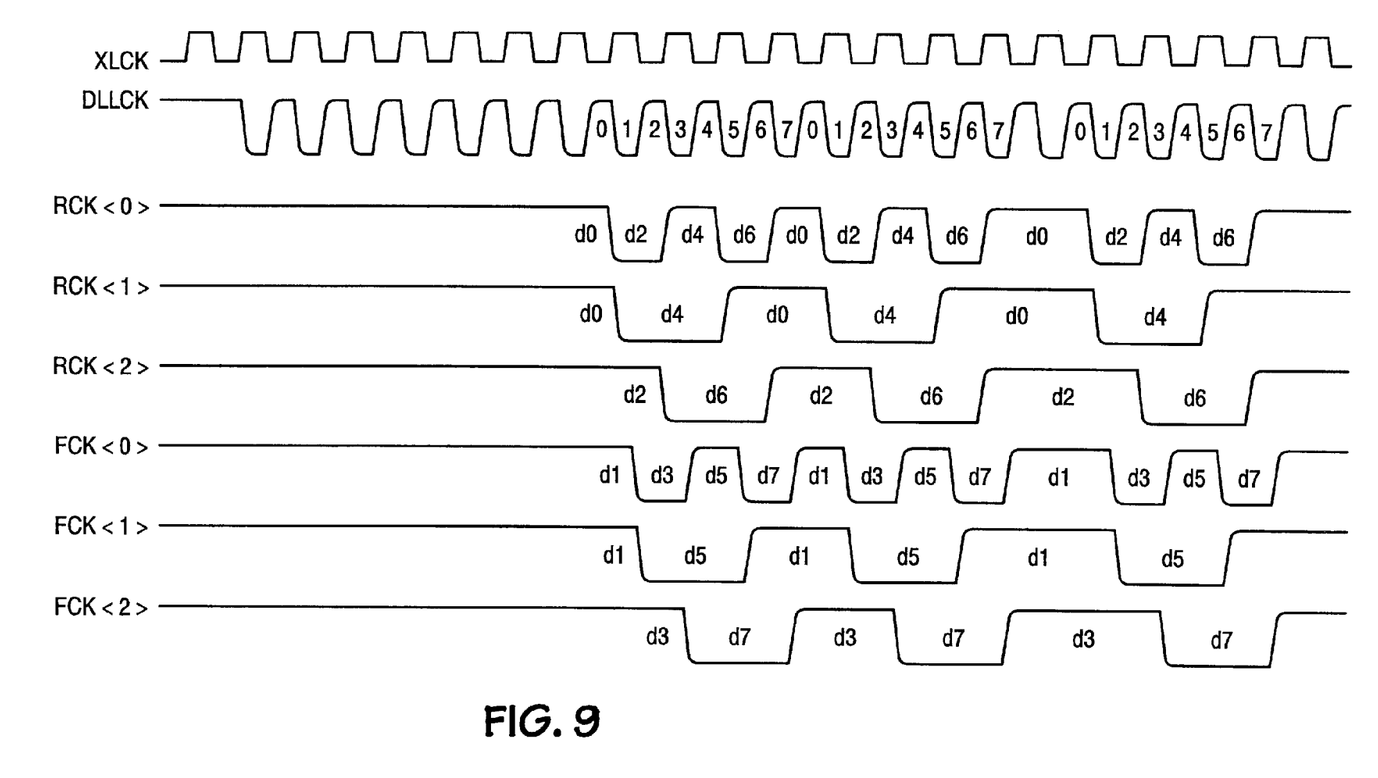
FIG. 9 is a timing diagram illustrating control and data signals in accordance with embodiments of the present invention.

Referring now to FIG. 9, a timing diagram of the external clock signal XCLK, the DLL clock signal DLLCK and each of the switch control signals RCK<0:2> and FCK<0:2> is illustrated. As illustrated, the DLLCK signal operates at the same speed as the XCLK signal, but slightly ahead of it to compensate for signal delays. As illustrated, the RCK<0> and FCK<0> signals are running at about half the speed of the DLLCK signal. In the next stage, RCK<1>, RCK<2>, FCK<1> and FCK<2> are operating at half the speed of the RCK<0> and FCK<0> signals (i.e., one quarter of the speed of the DLLCK signal).

Referring again to FIG. 3, and the first stage switches 70, the switch 70 under the control of RCK<1> always toggles between transmitting input data d0 and d4. That is, the switch 70, under the control of RCK<1> alternatingly transmits the data d0 and d4 through the switch 70. Similarly, the switch 70 under the control of RCK<2> toggles between input d2 and d6. The switch 70, under the control of FCK<1>, always toggles between data input d1 and d5. Finally, the switch 70 under the control of FCK<2> always toggles between the data d3 and d7. The relative timing of each of these control signals along with the data being output by the respective switches 70 is illustrated in FIG. 9.

As further illustrated, and referring to the second stage switches 70 (under the control of RCK<0> and FCK<0>) the output states and relative switching is further illustrated in FIG. 9. As will be appreciated, the output state of the switch 70 controlled by the signal RCK<0> toggles between transmitting the data d0, d2, d4 and d6, in that order, based on the configuration illustrated and described with reference to FIG. 3. That is, the switch 70 controlled by the signal RCK<0> alternatingly transmits the data d0, d2, d4 and d6, in that order, and repeats. Similarly, the switch 70 controlled by the signal FCK<0>, toggles between the data inputs d1, d3, d5 and d7, in that order. Based on this timing and control, those skilled in the art will appreciate that the binary data sort logic 64 and the particular arrangement of the input data d0-d7 into the data pipeline 62 (i.e., input from top to bottom of FIG. 3 as d0, d4, d2, d6, d1, d5, d3 and d7) will ensure that the parallel data from the internal data bus 54 is serialized and output on the read data bus 58 at a frequency eight times greater than that of the internal data bus 54. As will be appreciated, each slower stage uses the extra time as set up time for the data. For example RCK<0> works at half the speed of DLLCK. When DLLCK switch 70 is pointing to data from FCK<0> that is the time that RCK<0> switches, thereby allowing ½ of a DLLCK time for the data to switch from the RCK<0> controlled switch 70. Likewise RCK<1> switches when the RCK<0> controlled switch 70 is pointing to RCK<2>, and so forth.

Advantageously, embodiments of the present invention provide techniques for converting parallel data to serial data in high speed applications, such as high speed memory systems. In accordance with embodiments of the present techniques, the conversion is performed by employing a number of switches in the converter. Further, the converter is essentially operated under the control of the DLLCK signal and thus needs no control since it is a free-running clock signal.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A parallel-to-serial data converter comprising:
   a data pipeline configured to receive parallel data, wherein the parallel data comprises a data word having lower level bits and upper level bits;
   a plurality of data latches; and
   binary sort logic comprising a plurality of switches arranged to receive the lower and upper level bits in parallel and configured to output the parallel data serially, wherein a first switch is configured to transmit either a first data input bit or a second data input bit depending on a state of a first control signal, and wherein a second switch is configured to transmit either a third data input bit or a fourth data input bit depending on the data of a second control signal;

wherein each of the plurality of data latches is configured to trap a respective one of the upper level bits for a predetermined amount of time prior to transmitting the respective one of the upper level bits to the binary sort logic.

2. The parallel-to-serial converter of claim 1, wherein the data pipeline comprises a first plurality of sub-data pipelines configured to receive the lower level bits of the data word and a second plurality of sub-data pipelines configured to receive the upper level bits of the data word.

3. The parallel-to-serial converter of claim 2, wherein each of the plurality of data latches is coupled to a respective one of the second plurality of sub-data pipelines.

4. The parallel-to-serial converter of claim 3, wherein the plurality of switches comprises:
a first stage comprising a first plurality of switches configured to receive the lower level bits of the data word from the first plurality of sub-data pipelines and the upper level bits of the data word from the plurality of data latches in parallel;
a second stage comprising a second plurality of switches configured to receive the data from the first plurality of switches; and
a final stage comprising switching logic configured to receive the data from the second plurality of switches and configured to output the data serially.

5. The parallel-to-serial converter of claim 4, wherein the first plurality of switches comprises twice the number of the second plurality of switches.

6. The parallel-to-serial converter of claim 1, wherein each of the plurality of data latches is configured to trap a respective one of the upper level bits in response to a trap enable signal.

7. The parallel-to-serial converter of claim 6, wherein the trap enable signal is generated based at least partially on one of the first or second control signals.

8. A method for converting parallel data to serial data comprising:
receiving parallel data comprising a data word having lower level bits and upper level bits on eight data buses;
transmitting the lower level bits to a first switching stage on a first portion of the eight data buses;
trapping the upper level bits for a predetermined amount of time to ensure proper ordering transmission;
after the predetermined amount of time, transmitting the upper level bits to the first switching stage on a second portion of the eight data buses;
receiving the lower and upper level bits at the first switching stage;
transmitting data from the first switching stage on four data buses, wherein the data is transmitted on each of the four data buses by a respective clock signal;
receiving the data from the first switching stage on the four data buses at a second switching stage;
transmitting the data from the second switching on two data buses;
receiving the data from the second switching stage on the two data buses at a final switching stage; and
serially transmitting the data received by the final switching stage onto an output bus.

9. The method, as set forth in claim 8, wherein trapping the upper level bits comprises holding each of the upper level bits in a respective data latch.

10. The method, as set forth in claim 9, wherein trapping the upper level bits further comprises providing a trap enable signal to each of the respective data latches.

11. A parallel-to-serial converter comprising:
a data pipeline configured to receive parallel data, wherein the parallel data comprises an eight bit data word; and
binary sort logic comprising:
a first switching stage configured to receive the parallel data comprising:
a first plurality of switches, wherein each of the first plurality of switches is controlled by a respective one of a first plurality of clock signals and configured to transmit the parallel data on a rising edge of its respective clock signal;
a second plurality of switches, wherein each of the second plurality of switches is controlled by a respective one of a second plurality of clock signals and configured to transmit the parallel data on a falling edge of its respective clock signal; and
a second switching stage configured to receive the parallel data transmitted by the first switching stage and to further transmit the parallel data to a final switching stage, wherein the final switching stage is configured to serially transmit the parallel data on an output bus.

12. The parallel-to-serial converter of claim 11, wherein the data pipeline comprises eight sub-data pipelines, each configured to receive one of the eight bits of the data word.

13. The parallel-to-serial converter of claim 12, wherein the first switching stage is configured to receive the parallel data via eight data buses, each coupled to a respective one of the eight sub-data pipelines, and configured to transmit the parallel data on four data buses, and wherein the second switching stage is configured to receive the parallel data transmitted by the first switching stage on the four data buses and configured to transmit the parallel data on two data buses.

14. The parallel-to-serial converter if claim 13, wherein the first plurality of switches of the first switching stage comprises:
a first switch configured to receive a first bit of the eight bit data word via a first sub-data pipeline and to receive a fifth bit of the eight bit data word via a second sub-data pipeline, wherein the first switch is further configured to alternatingly transmit the first bit and the fifth bit onto a first of the four data buses, wherein the first and fifth bits are transmitted by the first switch on the rising edge of its respective clock signal; and
a second switch configured to receive a third bit of the eight bit data word via a third sub-data pipeline and to receive a seventh bit of the eight bit data word via a fourth sub-data pipeline, wherein the second switch is further configured to alternatingly transmit the third bit and the seventh bit onto a second of the four data buses, wherein the third and seventh bits are transmitted by the second switch on the rising edge of its respective clock signal; and
wherein the second plurality of switches of the first switching stage comprises:
a third switch configured to receive a second bit of the eight bit data word via a fifth sub-data pipeline and to receive a sixth bit of the eight bit data word via a sixth sub-data pipeline, wherein the third switch is further configured to alternatingly transmit the second bit and the sixth bit onto a third of the four data buses, wherein the second and sixth bits are transmitted by the third switch on the falling edge of its respective clock signal; and
a fourth switch configured to receive a fourth bit of the eight bit data word via a seventh sub-data pipeline and to receive an eighth bit of the eight bit data word via an eighth sub-data pipeline, wherein the fourth switch is further configured to alternatingly transmit the fourth bit and the eighth bit onto a fourth of the four data buses, wherein the fourth and eighth bits are transmitted by the fourth switch on the falling edge of its respective clock signal.

15. The parallel-to-serial converter of claim 14, wherein the second switching stage comprises:
   a fifth switch controlled by a first clock signal and configured to alternatingly receive the first bit and the fifth bit on the first of the four data buses and to alternatingly receive the third bit and the seventh bit on the second of the four data buses and further configured to alternatingly transmit each of the first bit, the third bit, the fifth bit, and the seventh bit onto a first of the two data buses, wherein the first, third, fifth, and seventh bits are transmitted by the fifth switch on the rising edge of the first clock signal; and
   a sixth switch controlled by a second clock signal and configured to alternatingly receive the second bit and the sixth bit on the third of the four data buses and to alternatingly receive the fourth bit and the eighth bit on the fourth of the four data buses and further configured to alternatingly transmit each of the second bit, the fourth bit, the sixth bit, and the eighth bit onto a second of the two data buses, wherein the second, fourth, sixth, and eighth bits are transmitted by the sixth switch on the falling edge of the second clock signal.

16. The parallel-to-serial converter of claim 15, wherein the final switching stage is configured to alternatingly receive the first bit, the third bit, the fifth bit and the seventh bit on the first of the two data buses and to alternatingly receive the second bit, the fourth bit, the sixth bit and the eighth bit on the second of the two data buses and further configured to alternatingly transmit the first bit, the second bit, the third bit, the fourth bit, the fifth bit, the sixth bit, the seventh bit and the eighth bit on the output bus.

17. The parallel-to-serial converter of claim 13, wherein the four data buses transmit data twice as fast as the eight data buses transmit data, wherein the two data bases transmits data twice as fast as the four data buses transmit data, and wherein the output bus transmits data twice as fast as the two data buses transmit data.

18. The parallel-to-serial converter of claim 11, wherein each of the first plurality of clock signals comprises a different phase, and wherein each of the second plurality of clock signals comprises a different phase.

19. The parallel-to-serial converter of claim 11, wherein the eight bit data word comprises bits numbered 0-7, wherein the even numbered bits are transmitted by the first switching stage on a rising edge of a clock signal, and wherein the odd numbered bits are transmitted by the first switching stage on the falling edge of a clock signal.

20. A method for manufacturing a parallel-to-serial converter comprising:
   providing a data pipeline configured to receive and transmit parallel data comprising a plurality of bits;
   providing a plurality of data latches coupled to a first portion of the data pipeline, wherein each of the plurality of data latches is configured to trap one of the plurality of bits for a predetermined amount of time at least partially in response to a trap signal;
   coupling a first switching stage to the data pipeline, the first switching stage comprising a first plurality of switches configured to receive the parallel data and configured to alternatingly transmit a first and a second portion of the parallel data on a first plurality of data buses, wherein each of the first plurality of switches is configured to be controlled by a respective one of a first plurality of control signals;
   coupling a second switching stage to the first plurality of data buses, the second switching stage comprising a second plurality of switches configured to alternatingly receive the first and second portion of the parallel data on the first plurality of data buses, and further configured to transmit a third and a fourth portion of the parallel data on a second plurality of data buses, wherein each of the second plurality of switches is configured to be controlled by a respective one of a second plurality of control signals;
   coupling a final switching stage to the second plurality of data buses, wherein the final switching stage comprises switching logic configured to alternatingly receive the third and fourth portions of the parallel data and to output the received parallel data as serial data; and
   coupling an output bus to the final switching stage, the output bus being configured to receive and transmit the serial data; and
   wherein the trap signal is determined based at least partially on the state of at least one of the first plurality of control signals and at least one of the second plurality of control signals.

21. The method, as set forth in claim 20, wherein the output bus is configured to transmit the serial data approximately eight times as fast as the data pipeline transmits data to the first switching stage.

22. The method, as set forth in claim 20, wherein the data pipeline comprises a plurality of sub-data pipelines, each configured to receive and transmit one of the plurality of bits.

23. The method, as set forth in claim 22, wherein the first portion of the data pipeline comprises half of the plurality of sub-data pipelines.

24. A parallel-to-serial converter comprising:
   means for receiving and transmitting an eight bit data word in parallel at a first frequency;
   means for trapping at least a portion of the eight bit data word in response to a trap signal, wherein the trap signal is determined based upon the states of two or more control signals;
   means for alternatingly transmitting even numbered bits of the eight bit data word on a rising edge of one or more clock signals;
   means for alternatingly transmitting odd numbered bits of the eight bit data word on a falling edge of one or more clock signals; and
   means for outputting the even and odd numbered bits of the eight bit data word serially at a second frequency, the second frequency being greater than the first frequency.

25. The parallel-to-serial converter of claim 24, wherein the second frequency is approximately eight times faster than the first frequency.

* * * * *

UNITED STATES PATENT AND TRADEMARK OFFICE
CERTIFICATE OF CORRECTION

PATENT NO. : 7,525,458 B2 Page 1 of 1
APPLICATION NO. : 12/033763
DATED : April 28, 2009
INVENTOR(S) : Morzano et al.

It is certified that error appears in the above-identified patent and that said Letters Patent is hereby corrected as shown below:

In column 12, line 36, in Claim 14, delete "if" and insert -- of --, therefor.

Signed and Sealed this

Fourteenth Day of July, 2009

JOHN DOLL
*Acting Director of the United States Patent and Trademark Office*